US006847320B1

(12) United States Patent
Taft et al.

(10) Patent No.: US 6,847,320 B1
(45) Date of Patent: Jan. 25, 2005

(54) ADC LINEARITY IMPROVEMENT

(75) Inventors: Robert C. Taft, Munich (DE);
Christopher A. Menkus, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/816,235

(22) Filed: Mar. 30, 2004

Related U.S. Application Data
(60) Provisional application No. 60/544,660, filed on Feb. 13, 2004.

(51) Int. Cl.[7] .................................................. H03M 1/12
(52) U.S. Cl. ......................... 341/155; 341/120; 341/159
(58) Field of Search ................................. 341/155, 156, 341/120, 139, 159, 158, 161, 118

(56) References Cited
U.S. PATENT DOCUMENTS 6,072,416 A * 6/2000 Shima .......................... 341/159

6,100,836 A * 8/2000 Bult .............................. 341/155
6,369,732 B1 * 4/2002 Liu et al. ..................... 341/143

OTHER PUBLICATIONS

Taft, Robert et al. Feb. 17, 2004. "High–Speed A/D Converters." *IEEE International Solid–State Circuits Conference:* Session 14:pp252–253.

* cited by examiner

*Primary Examiner*—Brian Young
*Assistant Examiner*—John B Nguyen
(74) *Attorney, Agent, or Firm*—Darby & Darby PC; John W. Branch

(57) ABSTRACT

A method and circuit for improving linearity of a folding or flash analog-digital-converter (ADC) circuit. Averaging resistors connect outputs of each of a bank of first pre-amplifiers. A series adjustment resistor is placed between each node connecting the output of a first bank pre-amplifier and the associated averaging resistor, and the input of each of a second bank pre-amplifier. An adjustment current is injected through the adjustment resistor during a calibration. A permanent value for adjustment current is determined such that an effect of offset errors is substantially minimized.

23 Claims, 6 Drawing Sheets

US 6,847,320 B1

ADC LINEARITY IMPROVEMENT

RELATED APPLICATION

This application claims the benefit of U.S. Provisional Application Ser. No. 60/544,660 filed Feb. 13, 2004, the benefit of the earlier filing date of which is hereby claimed under 35 U.S.C. § 119 (e).

FIELD OF THE INVENTION

The present invention relates to analog-to-digital conversion, and, in particular, to a circuit and method for improvement of linearity in a folding or a flash type analog-digital-converter.

BACKGROUND

An analog-digital-converter (ADC) is employed to change/convert an analog input signal into a digital output signal. There are several different types of ADC architectures in current use, including pipeline, flash and folding. In a flash ADC, k bits of resolution employ $2^k$ comparators to convert an analog signal into a digital signal. Folding ADCs are a variation of a typical flash ADC architecture except that they are arranged to map the analog input signal range into N regions where each of these N regions share the same comparators. In a folding ADC, the total number of comparators is typically $2^k/N+(N-2)$.

Flash and folding ADCs may be scaled to very high conversion speeds, since they do not use decision feed-back loops. These two architectures, unfortunately, can be sensitive to device mismatch, leading to linearity degradation. This is especially true of CMOS folding ADCs, since CMOS devices have larger offsets than bipolar devices.

Thus, it is with respect to these considerations and others that the present

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION

Figure 1:
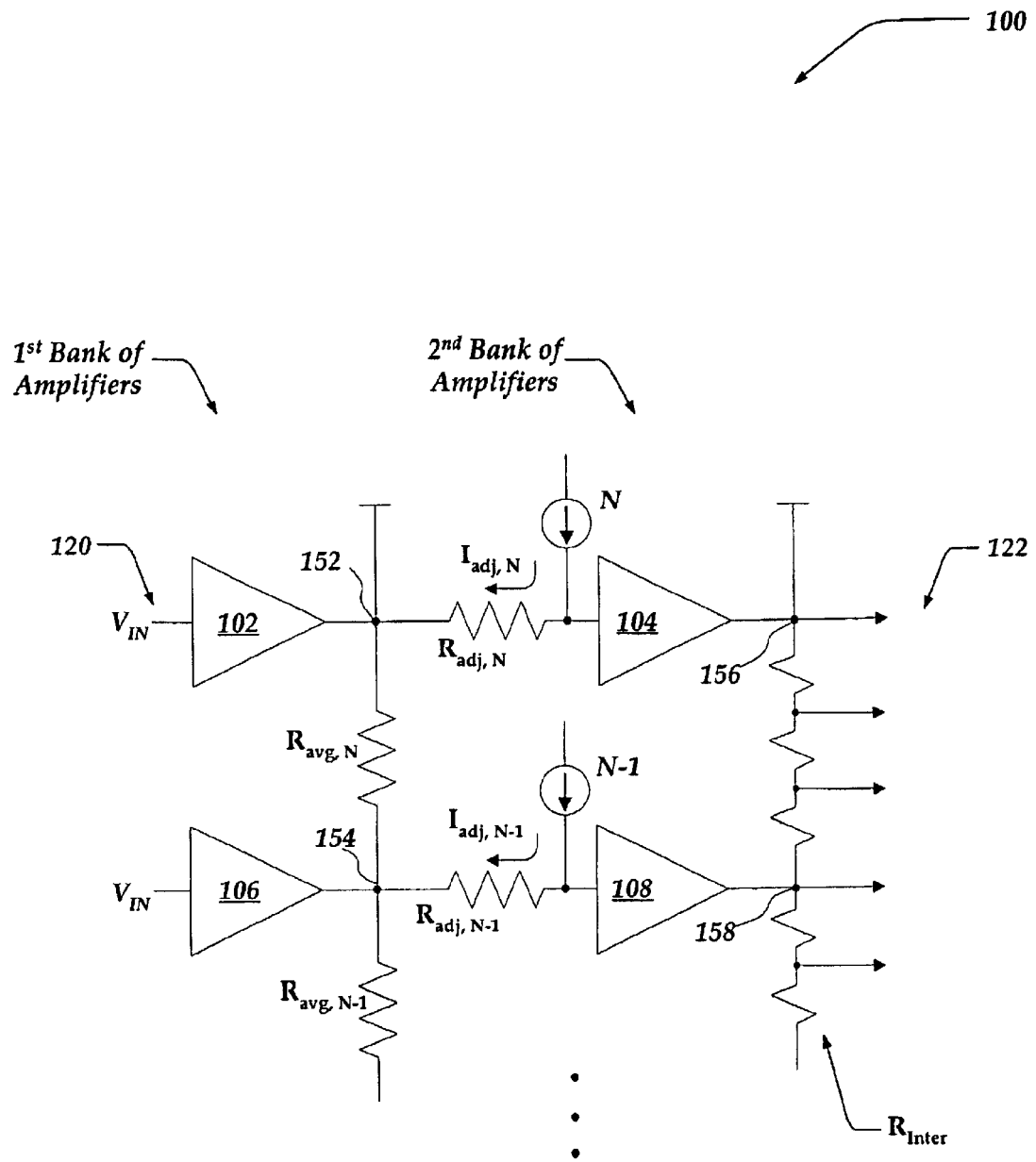
FIG. 1 illustrates an exemplary single-ended embodiment of the present invention in a pre-amplification circuit of a folding ADC.

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

The terms "comprising," "including," "containing," "having," and "characterized by," refers to an open-ended or inclusive transitional construct and does not exclude additional, unrecited elements, or method steps. For example, a combination that comprises A and B elements, also reads on a combination of A, B, and C elements.

The meaning of "a," "an," and "the" include plural references. The meaning of "in" includes "in" and "on." Additionally, a reference to the singular includes a reference to the plural unless otherwise stated or is inconsistent with the disclosure herein.

The term "or" is an inclusive "or" operator, and includes the term "and/or," unless the context clearly dictates otherwise. The phrase "in one embodiment," as used herein does not necessarily refer to the same embodiment, although it may. The term "based on" is not exclusive and provides for being based on additional factors not described, unless the context clearly dictates otherwise.

The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the present invention is related to improving linearity in a folding or flash analog-digital-converter. A series adjustment resistor is placed between an input of each second stage amplifier and an output of each first stage amplifier. An adjustment current is applied during a predetermined measurement interval and a value of the adjustment current determined so that an overall effect of offset error is minimized.

Between an input track & hold (sample & hold) circuit and comparator circuit of an ADC, there may be multiple levels of pre-amplification. The first bank of amplifiers may have their output averaged to reduce the effect of offset errors. An amplifier with a large offset is pulled into line by neighboring amplifiers using the resistors tying their outputs together. The second bank also has averaging. However, due to the signal being amplified by the first amplifier before going into the second amplifier, the effect of averaging is much less. An offset in one of the first bank amplifiers creates a broad peak in the ADC's transfer characteristic, and an offset in one of the second bank amplifiers creates a sharp peak. Cascading of the arrayed amplifier banks results in their offsets being added, but with a different shape.

FIG. 1 schematically illustrates an exemplary embodiment of pre-amplification circuit 100 of a folding ADC. Pre-amplification circuit 100 is configured to receive a single-ended analog signal ($V_{IN}$) at an input of amplifiers 102 and 106. Amplifiers 102 and 106 are representative of a number of amplifiers forming first bank of amplifiers. Total number of amplifiers in the first bank of amplifiers is determined based, in part, on a desired resolution of a digital output signal of the ADC.

Outputs of representative amplifiers 102 and 106 are connected through averaging resistor $R_{avg,\ N}$ between nodes 152 and 154. Nodes 152 and 154 are further connected to adjustment resistor $R_{adj,\ N}$. Adjustment resistor $R_{adj,\ N}$ is further connected to an input of representative amplifier 104 of second bank of amplifiers. An output of amplifier 104 is connected through averaging resistors to the outputs of other amplifiers in the second bank of amplifiers. Node 156, which connects the output of amplifier 104 and two interpolation resistors is further connected to output 122. Output 122 is connected to an input of a comparator circuit (not shown).

The above described connection of representative amplifier 102 through node 152, adjustment resistor $R_{adj,\ N}$, and amplifier 104 to the output, is repeated for amplifiers 106 and 108 with adjustment resistor $R_{adj,\ N-1}$. As mentioned above amplifiers 106 and 108 are connected to other amplifiers in their respective banks through further In one embodiment an analog signal ($V_{IN}$) is provided to the first bank of amplifiers through input 120 from a track-and-hold circuit (not shown). Amplification in the first bank of amplifiers, averaging by the averaging resistors, and amplification by the second bank of amplifiers subjects the analog signal to offset errors. Amplifier offsets, as well as mismatch in resistor values and current mirror ratios, can all contribute to the total offset error. Although offset error can result from multiple components, the total offset error may be corrected at one point in the chain of components. Injection of the adjustment current $I_{adj,\ N}$ through adjustment resistor $R_{adj,\ N}$ provides a relatively flat analog-to-digital transfer curve for the ADC employing pre-amplification circuit 100.

Figure 2:
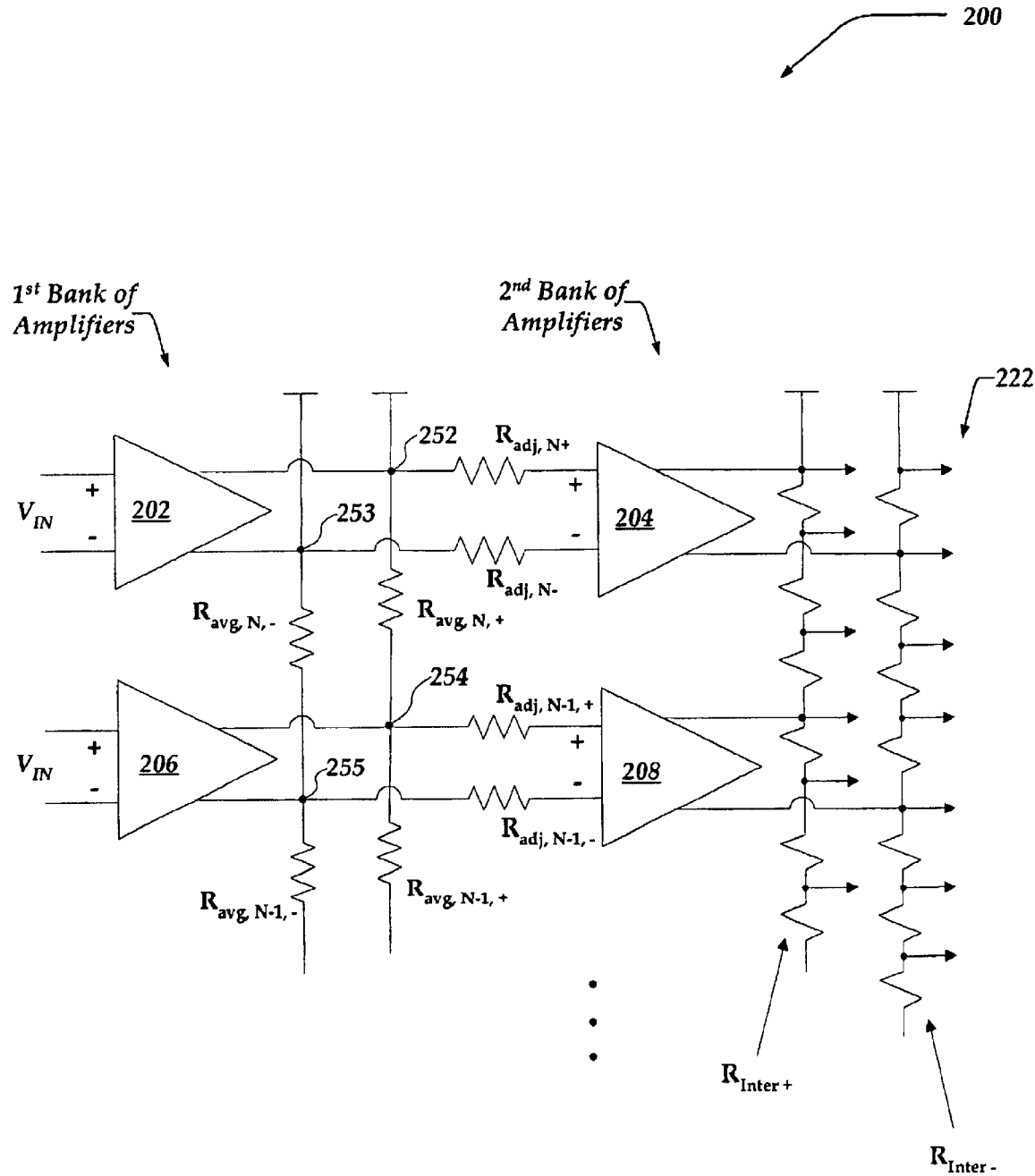
FIG. 2 illustrates an exemplary differential embodiment of the present invention in a pre-amplification circuit of a folding ADC.

FIG. 2 schematically illustrates an exemplary embodiment of pre-amplification circuit 200. Pre-amplification circuit 200 is configured to receive a differential analog signal ($V_{IN}$) at the positive and negative inputs of amplifiers 202 and 206. Similar to FIG. 1, amplifiers 202 and 206 are representative of a number of amplifiers forming first bank of amplifiers. As are amplifiers 204 and 208 representative for the number of amplifiers in the second bank of amplifiers. The second bank of amplifiers is a folding stage. Nodes 252 and 253 connect averaging resistors $R_{avg,\ N+}$ and $R_{avg,\ N-}$ with respective outputs of amplifier 202, as well as adjustment resistors $R_{adj,\ N+}$ and $R_{adj,\ N-}$. Adjustment resistors $R_{adj,\ N+}$ and $R_{adj,\ N-}$ are further coupled to positive and negative inputs of amplifier 204 of the second bank of amplifiers. Positive and negative outputs of amplifier 204 are connected to other amplifiers, such as amplifier 208, of the second bank of amplifiers through interpolation resistors ($R_{inter}$). Folded outputs of pre-amplification circuit 200 are connected to a comparator circuit (not shown).

Similar to FIG. 1, the pre-amplification sequence described above is repeated in FIG. 2 as well. In another embodiment pre-amplification circuit 200 may have at least one additional bank of amplifiers between the first bank and the second bank. In yet another embodiment, the additional bank of amplifiers may have additional averaging resistors and adjustment resistors similar to the configuration described above. In a further embodiment, the additional bank of amplifiers may have interpolation resistors coupled to its outputs in place of averaging resistors.

Figure 3:
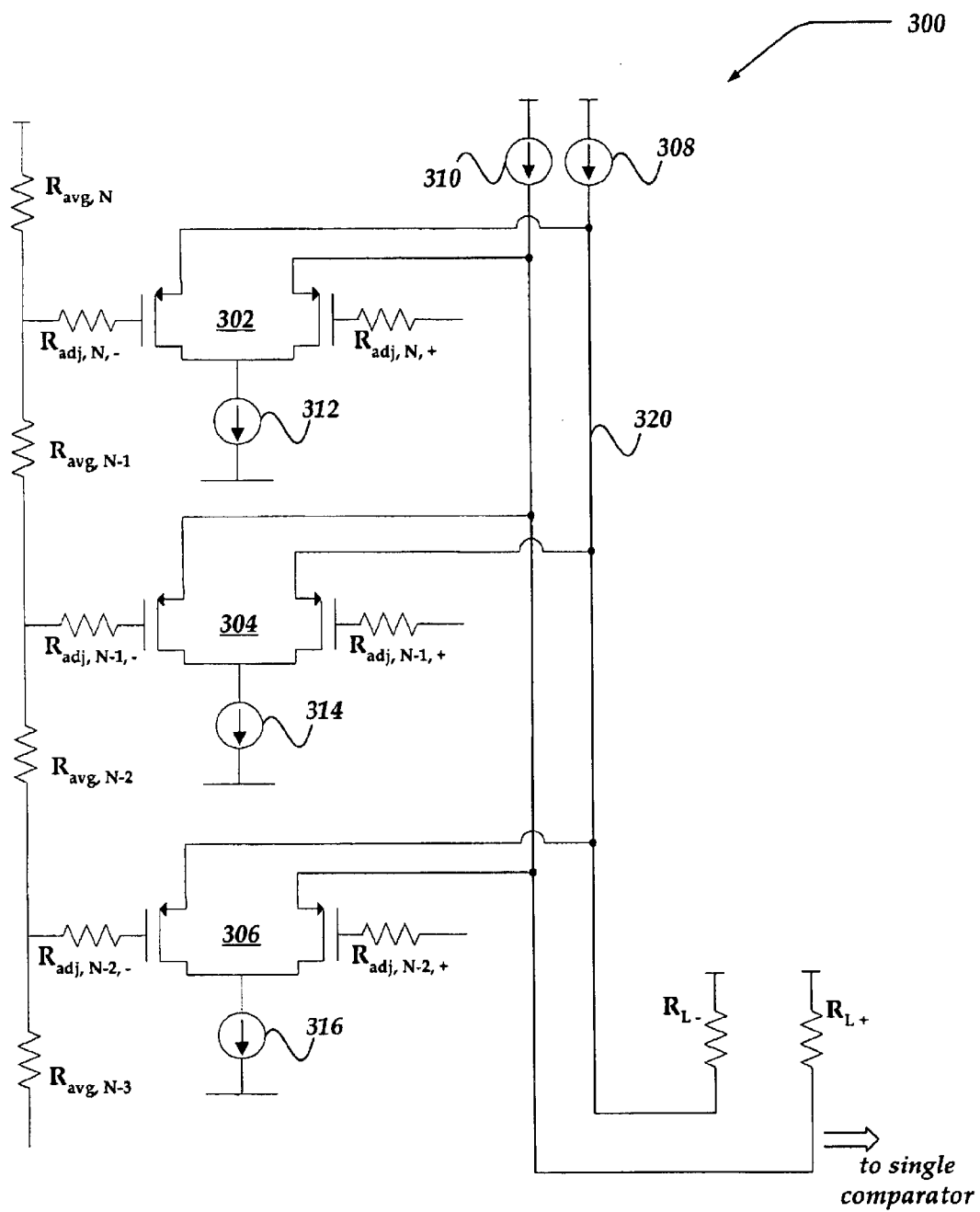
FIG. 3 illustrates an exemplary amplifier circuit in accordance with an embodiment of the present invention.

FIG. 3 illustrates a more detailed schematic of one embodiment of folding amplifier triplet 300 in accordance with the present invention, such as those in $2^{nd}$ amplifier bank in FIG. 2. Folding amplifier triplet 300 includes current sources 308 and 310 connected to parallel transistor pairs 302, 304, 306. Averaging resistors $R_{avg,\ N+}$, $R_{avg,\ N-}$, and the like, connect inputs of individual transistors in amplifier triplet 300 (only one set of averaging resistors shown). Current sources 312, 314, 316 connect the transistor pairs to ground. Each transistor in transistor pairs 302, 304, 306 has a series adjustment resistor, $R_{adj,\ N,\ +}$, $R_{adj,\ N-1,\ +}$, and the like, coupled to its input. Adjustment currents $I_{adj,\ N-1,\ -}$ and $I_{adj,\ N-1,\ -}$ (not shown) are injected through adjustment resistors $R_{adj,\ N,\ +}$ and $R_{adj,\ N,\ -}$. The outputs of transistor pairs 302, 304, 306 are connected through folding bus 320 to an input of a comparator in a comparator circuit. In one embodiment all three transistor pairs are coupled to a single comparator. In another embodiment a ratio of amplifiers to comparators may be determined based, in part, on a desired resolution of a digital output signal of the ADC.

Figure 4:
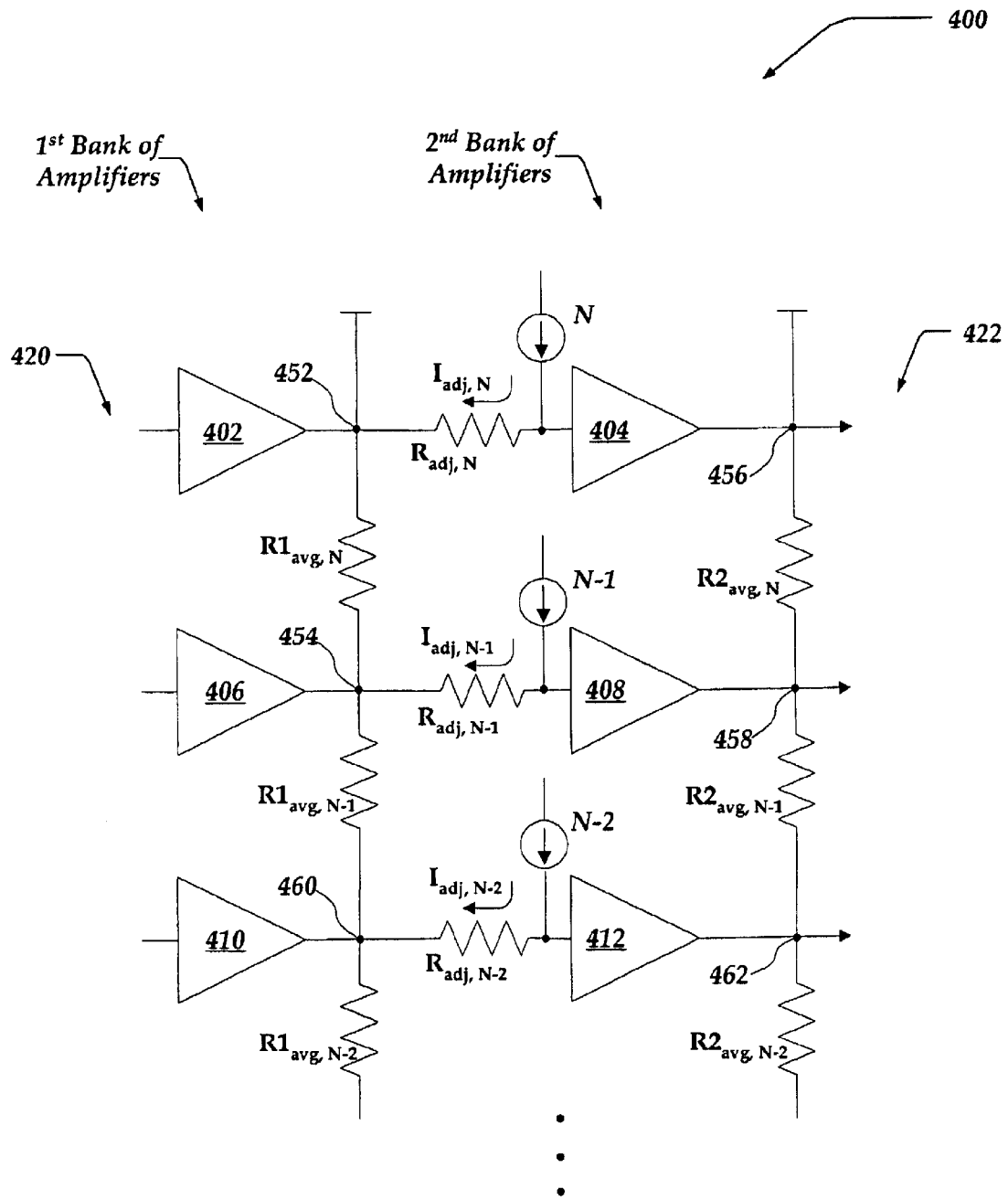
FIG. 4 illustrates an exemplary single-ended embodiment of the present invention in a pre-amplification circuit of a flash ADC.

FIG. 4 schematically illustrates an exemplary embodiment of pre-amplification circuit 400 of a flash ADC. Pre-amplification circuit 400 is configured to receive a single-ended analog signal at input 420 of amplifiers 402, 406, and 410. Amplifiers 402, 406, and 410 are representative of a number of amplifiers forming first bank of amplifiers. The total number of amplifiers in the first bank of amplifiers is determined based, in part, on a desired resolution of a digital output signal of the ADC.

The outputs of representative amplifiers 402 and 406 are corrected through averaging resistor $R1_{avg,\ N}$ between nodes 452 and 454. Node 452 is further connected to adjustment resistor $R_{adj,\ N}$. Adjustment resistor $R_{adj,\ N}$ iS further connected to an input of representative amplifier 404 of second bank of amplifiers. An output of amplifier 404 is connected through node 456, which connects the outputs of other amplifiers in the second bank of amplifiers through averaging resistors, to output 422. Output 422 is connected to an input of a comparator circuit (not shown).

The above described connection of representative amplifier 402 through node 452, adjustment resistor $R_{adj,\ N}$, and amplifier 404 to the output, is repeated for amplifiers 406 and 408 with adjustment resistor $R_{adj,\ N-1}$. As mentioned above amplifiers 406 and 408 are connected to other amplifiers in their respective banks through further averaging resistors.

In one embodiment an analog signal ($V_{IN}$) is provided to the first bank of amplifiers through input 420 from a track-and-hold circuit (not shown). The signal is processed in pre-amplification circuit 400 as described in FIG. 1, and provided to the comparator circuit, wherein the injection of adjustment current $I_{adj,\ N}$ through adjustment resistor $R_{adj,\ N}$ provides a relatively flat analog-to-digital transfer curve for the flash ADC employing pre-amplification circuit 400. In another embodiment pre-amplification circuit 400 may have at least one additional bank of amplifiers between the first bank and the second bank. In yet another embodiment, the additional bank of amplifiers may have additional averaging resistors and adjustment resistors similar to the configuration described above. It is understood that all embodiments described here may be implemented for a differential signal as well.

Figure 5:
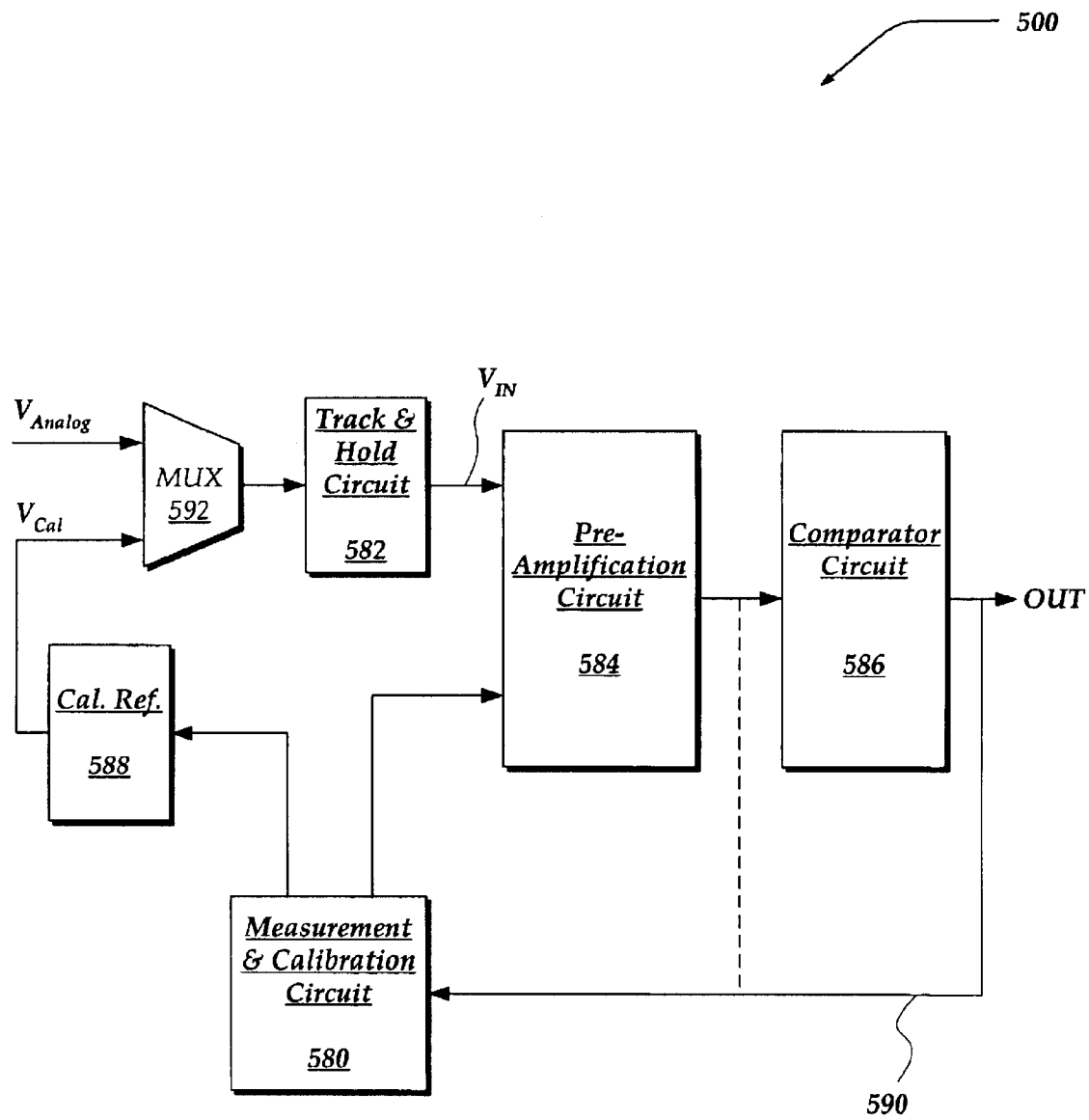
FIG. 5 illustrates a block diagram of an exemplary ADC, in which the present invention may operate.

FIG. 5 illustrates a block diagram of one embodiment of the inventive analog-to-digital converter circuit (500). Circuit 500 includes several components such as a multiplexer (MUX) 592, an optional track-and-hold circuit 582, a pre-amplification circuit 584, a comparator circuit 586, a measurement-and-calibration circuit 580, and a calibration reference circuit 588. FIG. 5 shows the particular arrangement of inputs and outputs of the various components. In one embodiment, all of the components of circuit 500 are included in the same chip. Alternatively, one or more of the components of circuit 500 may be off-chip.

According to one embodiment, the ADC is calibrated at first power-on. An analog calibration signal ($V_{Cal}$) is provided to track-and-hold circuit 582 from calibration reference circuit 588. Measurement-and-calibration circuit 580 compares an output 590 of each comparator in comparator circuit 586 to an expected comparator output determining whether an adjustment current injected through the adjustment resistors in pre-amplification circuit 584 needs to be increased or decreased reducing total offset error in pre-amplification circuit 584. After each determination, measurement-and-calibration circuit 580 causes calibration reference circuit 588 to modify the analog calibration voltage. This iterative calibration process is performed a preset number of times.

In another embodiment, measurement-and-calibration circuit 580 may measure an output of pre-amplification circuit 584 and make the determination of modifying the analog calibration signal based, in part, on that output. In yet another embodiment, measurement-and-calibration circuit 580 may make the determination based, in part, on actual minimization of total offset error instead of a preset number of iterative steps.

During standard operation, an analog signal ($V_{Analog}$) is provided to optional track-and-hold circuit 582 through a multiplexer. Pre-amplification circuit 584 receives the signal provided by track-and-hold circuit 582, amplifies, and forwards it to comparator circuit 586. Comparator circuit 586 performs a comparison function and provides output signal (OUT) to an encoder circuit (not shown).

In one embodiment, track-and-hold circuit 582 is a switched capacitor circuit, and the like. A folding ADC may include pre-amplification circuit 584 with one or more folding stages. A flash ADC may include pre-amplification circuit 584 with no folding stages.

Figure 6:
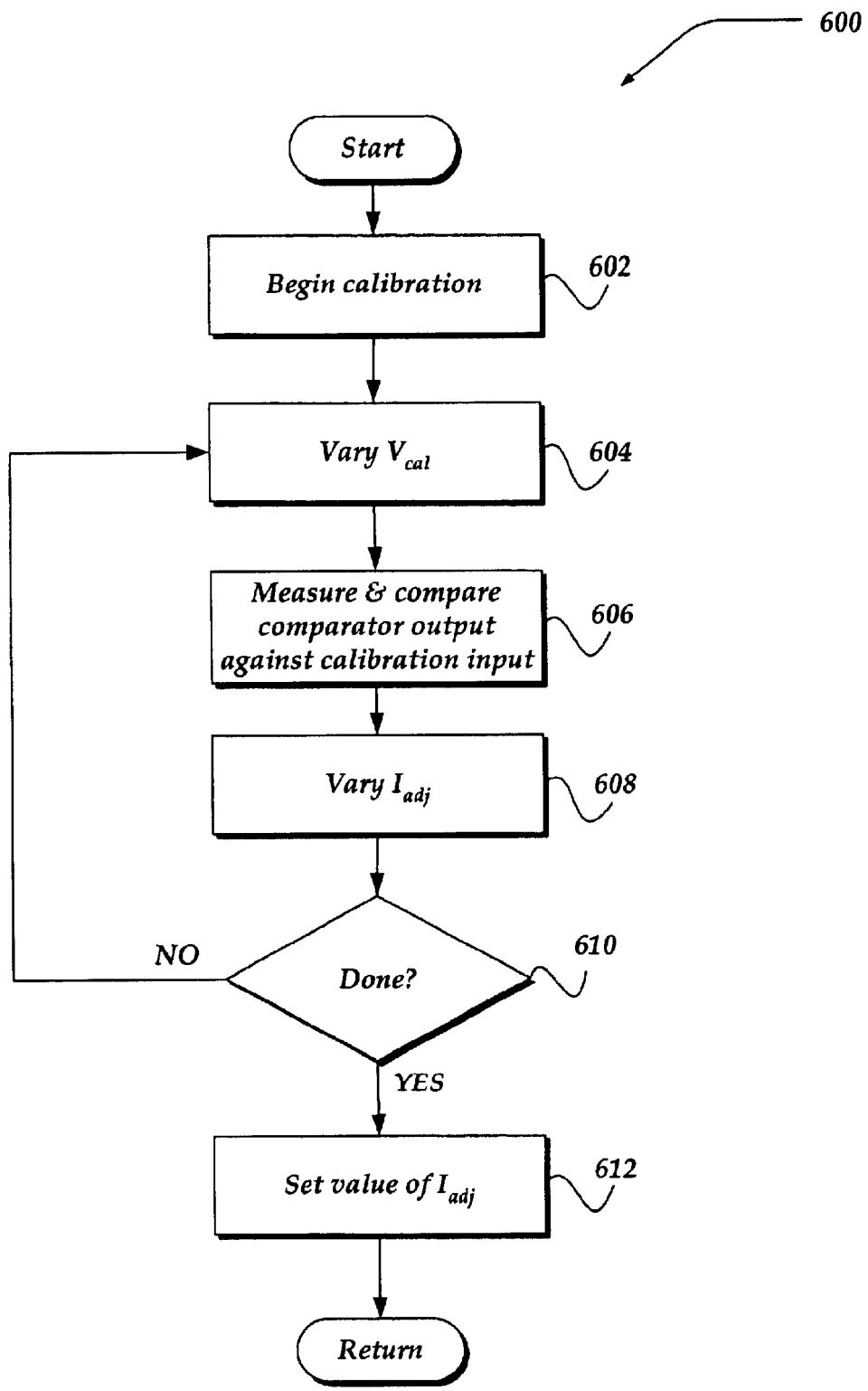
FIG. 6 illustrates a flow chart of an exemplary calibration process of an ADC in accordance with the present invention.

FIG. 6 illustrates a flow chart of an exemplary process of calibration (600) for an ADC. After a start block, the process proceeds to block 602, where the calibration is initiated. At block 604, a value for calibration voltage $VC_{Cal}$ is set. Then at block 606, measurement-and-calibration circuit 580 of FIG. 5 compares an output of comparator circuit to an expected output to determine whether an increase or decrease of adjustment current $I_{adj}$ is needed. Upon determination measurement-and-calibration circuit begins to vary, at block 608, the adjustment current $I_{adj}$ injected through adjustment resistors $R_{adj, N}$ into the inputs of the amplifiers in pre-amplification circuit 584. As discussed above measurement-and-calibration circuit 580 performs this task a predetermined number of times. At decision block 610, the number of iterations is counted. When the predetermined number of times is reached, the process proceeds to block 612. Otherwise, the process goes back to block 604 for additional variation of calibration voltage $V_{Cal}$. At block 612, a permanent value of adjustment current $I_{adj}$ is set. Next, the process proceeds to the return block and return to performing other actions including standard encoding operation of the ADC.

Process 600 is independently performed during a calibration phase. The calibration phase may be during first power-on, after significant temperature changes, and the like. In another embodiment measurement and comparison performed at block 606 may be based, in part, on actual measurement and minimization of total offset error instead of a predetermined iterative reduction process.

The above specification, examples and data provide a description of the manufacture and use of the composition of the invention. Since many embodiments of the invention can be made without departing from the spirit and scope of the invention, the invention also resides in the claims hereinafter appended.

We claim:

1. A circuit for analog-to-digital conversion, comprising:
    a first pre-amplification circuit, comprising a plurality of amplifiers;
    a second pre-amplification circuit, comprising a plurality of amplifiers, that is coupled to the first pre-amplification circuit; and
    a series of adjustment resistors coupled between an output of each of the first amplifiers of the first pre-amplification circuit and an input of each of the amplifiers of the second pre-amplification circuit.

2. The circuit of claim 1, further comprising a series of averaging resistors coupled between an output of each amplifier of the first pre-amplification circuit at a first series of nodes.

3. The circuit of claim 1, further comprising at least one additional pre-amplification circuit comprising a plurality of amplifiers and one additional associated series of averaging resistors coupled between an output of each amplifier of the additional pre-amplification circuit.

4. The circuit of claim 3, further comprising at least one additional series of adjustment resistors coupled to an input of each amplifier of the additional pre-amplification circuit.

5. The circuit of claim 4, wherein each pre-amplification circuit is configured to receive an adjustment current.

6. The circuit of claim 5, wherein the adjustment current is determined during a calibration of the analog-to-digital conversion circuit by varying the adjustment current such that an effect of total offset error for each pre-amplification circuit is substantially minimized.

7. The circuit of claim 6, wherein the calibration is performed during at least one of when the circuit is first powered on and when an operating temperature of the analog-to-digital conversion circuit exceeds a predetermined threshold.

8. The circuit of claim 1, further comprising a series of interpolation resistors coupled between an output of each amplifier of the second pre-amplification circuit at a second series of nodes, wherein at least one of an averaging and an interpolation resistor is coupled between outputs of any two amplifiers, and wherein the second series of nodes are coupled to an input of a comparator in a comparator circuit at a predetermined ratio.

9. The circuit of claim 8, wherein the predetermined ratio of amplifier outputs to comparator inputs is three to one.

10. The circuit of claim 1, further comprising:
    a series of averaging resistors coupled between an output of each amplifier of the first pre-amplification circuit at a first series of nodes; and
    a series of averaging resistors coupled between an output of each amplifier of the second pre-amplification circuit at a second series of nodes.

11. The circuit of claim 1, further comprising:
    a comparator circuit comprising a plurality of comparators, wherein an input of each comparator is coupled to a node in the second series of nodes.

12. The circuit of claim 10, further comprising at least one additional pre-amplification circuit, comprising a plurality of amplifiers, that is coupled between the first and second pre-amplification circuits and one additional associated series of averaging resistors between an output of each amplifier of the additional pre-amplification circuit.

13. The circuit of claim 12, further comprising at least one additional series of adjustment resistors coupled to the inputs of the at least one additional pre-amplification circuit.

14. The circuit of claim 10, wherein the adjustment current is determined during a calibration of the analog-to-digital conversion circuit by varying the adjustment current such that an effect of total offset error for each pre-amplification circuit is substantially minimized.

15. The circuit of claim 10, wherein a number of amplifiers in the pre-amplification circuit is determined by a desired resolution of an output digital signal.

16. The circuit of claim 10, wherein the amplifiers comprise transistor pairs, each of the respective transistor pairs further comprising a respective current source driving the pair.

17. The circuit of claim 16, wherein the transistor pairs further comprise at least one of a BJT transistor pair, a FET transistor pair, and a CMOS transistor pair.

18. A method for improving linearity of an analog-to-digital conversion circuit, the method comprising:
   providing an adjustment current, during a calibration of the analog-to-digital conversion circuit, to each amplifier in a pre-amplification circuit through an adjustment resistor coupled to an input of each amplifier; and
   determining a value of the adjustment current, such that an effect of offset error in an output of each pre-amplification circuit is substantially minimized.

19. The method of claim 18, wherein the adjustment current comprises one of a single-ended current and a differential current.

20. A method for determining a digital value of an analog signal, the method comprising:
   receiving an analog signal through an input of an amplifier in a first pre-amplification circuit;
   subjecting the analog signal to an averaging process and an adjustment process, wherein:
      the averaging process is performed by a series of averaging resistors connecting outputs of the amplifiers of the first pre-amplification circuit, and
      the adjustment process is performed by injecting an adjustment current into an adjustment resistor connecting an output of an amplifier of the first pre-amplification circuit to an input of an amplifier of a second pre-amplification circuit; and
   performing a comparison on the pre-amplified analog signal in a comparator circuit that is coupled to the second pre-amplification circuit.

21. The method of claim 20, wherein a value of the adjustment current is determined during a calibration process such that an effect of offset error of the pre-amplification circuits is substantially minimized.

22. The method of claim 20, wherein the calibration process is performed during at least one of when the pre-amplification circuits are first powered on and when an operating temperature of the pre-amplification circuits exceeds a predetermined threshold.

23. A circuit with an analog-to-digital conversion architecture, comprising:
   means for providing a first pre-amplification comprising a plurality of amplifying means;
   means for providing a second pre-amplification with a folding analog-to-digital converter architecture comprising a plurality of amplifying means;
   means for providing averaging between outputs of each amplifying means in the first pre-amplification means;
   means for providing an adjustment between each of the first output amplifying means in the first pre-amplification means and an input of each of the amplifying means of the second pre-amplification means; and
   means for comparing to convert analog signal to digital signal, coupled to an output of the second pre-amplification means.

* * * * *

UNITED STATES PATENT AND TRADEMARK OFFICE
CERTIFICATE OF CORRECTION

PATENT NO.    : 6,847,320 B1
DATED         : January 25, 2005
INVENTOR(S)   : Robert C. Taft et al.

It is certified that error appears in the above-identified patent and that said Letters Patent is hereby corrected as shown below:

Column 1,
Line 35, after "present" insert -- invention has been made. --.

Column 3,
Line 22, after "further" insert -- averaging and interpolation resistors. --.

Column 4,
Line 30, delete "corrected" and insert -- connected --.

Column 5,
Line 7, delete "($V_{ca\ l}$)" and insert -- ($V_{cal}$) --.

Signed and Sealed this

Nineteenth Day of July, 2005

JON W. DUDAS
*Director of the United States Patent and Trademark Office*